United States Patent [19]

Okumura et al.

[11] Patent Number: 4,984,055
[45] Date of Patent: Jan. 8, 1991

[54] SEMICONDUCTOR DEVICE HAVING A PLURALITY OF CONDUCTIVE LAYERS AND MANUFACTURING METHOD THEREFOR

[75] Inventors: Yoshinori Okumura; Atsuhiro Fujii; Masao Nagatomo; Hiroji Ozaki; Wataru Wakamiya; Takayuki Matsukawa, all of Hyogo, Japan

[73] Assignee: Mitsubishi Denki Kabushiki Kaisha, Tokyo, Japan

[21] Appl. No.: 267,103

[22] Filed: Nov. 7, 1988

[30] Foreign Application Priority Data

Nov. 25, 1987 [JP] Japan .................. 62-298122

[51] Int. Cl.⁵ .................. H01L 29/34; H01L 29/68; H01L 29/06
[52] U.S. Cl. .................. 357/54; 357/23.6; 357/49; 357/51; 357/55
[58] Field of Search .................. 357/54, 23.6, 51, 55, 357/49

[56] References Cited

U.S. PATENT DOCUMENTS

| | | | |
|---|---|---|---|
| 4,475,964 | 10/1984 | Ariizumi et al. | 357/54 |
| 4,799,093 | 1/1989 | Kohara et al. | 357/54 |
| 4,859,615 | 8/1989 | Tsukamoto et al. | 357/23.6 |
| 4,887,136 | 12/1989 | Matsuda et al. | 357/23.6 |

FOREIGN PATENT DOCUMENTS 61-102754 5/1986 Japan .

OTHER PUBLICATIONS

Eiichi Kashiwagi, "On OCD-GSB", Lecture Proceedings, 5th Tokyo Ohka Seminar, Dec. 4, 1984, pp. 26-43.

*Primary Examiner*—Andrew J. James
*Assistant Examiner*—Ngan Van Ngo
*Attorney, Agent, or Firm*—Lowe, Price, LeBlanc, Becker & Shur

[57] ABSTRACT

A semiconductor device having a plurality of conductive layers is disclosed. The device has first level conductors (9) formed spaced apart on a semiconductor substrate (1). The semiconductor substrate (1) is provided with impurity diffusion regions (11) in its major surface between adjacent first level conductors (9). A triple layer insulation formed of a pair of oxide layers (12, 14) and an silicon oxide layer (13) sandwiched between the oxide layers (12, 14) covers the semiconductor substrate (1) and the first level conductors (9) thereon. At least one contact hole (15) is formed to extend through the triple layer insulation to either the impurity diffusion region (11) in the semiconductor substrate (1) or the first level conductor (9) on the semiconductor substrate (1). A second level conductor (16, 17) is provided on the triple layer insulation and on the inner surrounding wall of the contact hole (15). Each of the three insulating layers in the triple layer insulation has its hole-defining surface exposed at the contact hole (15) flush with or displaced laterally into the contact hole (15) away from a corresponding hole-defining exposed surface of the next overlying insulating layer.

12 Claims, 12 Drawing Sheets

SEMICONDUCTOR DEVICE HAVING A PLURALITY OF CONDUCTIVE LAYERS AND MANUFACTURING METHOD THEREFOR

BACKGROUND OF THE INVENTION

1. Field of the Invention

This invention relates to an improved semiconductor device having a plurality of conductive layers and a method for manufacturing the same. More particularly, this invention relates to a high density multilayer semiconductor device having a plurality of alternately stacked conductive layers and insulating layers, and a method for manufacturing the same.

2. Description of the Prior Art

In recent years, components in a semiconductor device are being made increasingly smaller as IC technology advances, resulting in a greater component density and higher integration of semiconductor devices. An increasing component density presents a problem encountered in multilayer conductor design of the semiconductor device, i.e., that the conductor in an upper layer is broken due to surface depressions or fall-downs caused by an underlying lower conductive layer.

This situation is explained with reference to FIGS. 1A–1C. As shown, the semiconductor device includes a semiconductor substrate 1, the upper or major surface of which is covered with an insulating layer 8. A plurality of transfer gate electrodes 9 are formed spaced apart from one another on the insulating layer 8. An oxide layer 12 is coated on the substrate to cover all of the transfer gate electrodes 9. The oxide layer 12 electrically insulates the transfer gate electrodes 9 comprising a lower conductive layer from an upper conductive layer to be formed on the oxide layer 12. The transfer gate electrodes being of a generally rectangular cross-section, when the metal oxide layer 12 is uniformly applied on the substrate, it plunges or falls down between adjacent gate electrodes forms small pits or depressions. In FIG. 1A, since the lateral distance or gap between the transfer gate electrodes 9 is relatively large, the downward slope of the oxide layer 12 at the surrounding walls of the pits or depressions is rather gentle.

As illustrated in FIG. 1B, the gap between the gate electrodes becomes narrower with an increasing component density in an IC or semiconductor device. With the narrower gaps, an abrupt and steep downward slope is found in the coated oxide layer 12 at the surrounding walls of the pits between the gate electrodes. In addition to the ever diminishing gap, in a transfer gate transistor, a lightly doped drain configuration or LDD structure is an indispensable feature for improving its performance characteristics. In order to realize this LDD structure, it is a common expedient to provide a side wall oxide layer 10 at the opposite sides of each transfer gate electrode 9 as illustrated in FIG. 1C. This addition of the side wall oxide layer 10 contributes to a further reduction in gate-to-gate gap, resulting in even steeper surrounding walls of the depressions. In comparison, while the inter-gate depressions have positively sloped walls in a convex profile in FIG. 1B, the depressions of FIG. 1C have negatively sloped walls in a concave profile. In any case, the presence of such abrupt steps or slopes in the surface of the oxide layer 12 is detrimental in that it may give rise to shorting or breakage in the upper conductive layer to be formed on the oxide layer 12.

One approach to solve this problem of the abrupt slope is to provide an insulating layer of spin-on-glass (hereinafter referred to as SOG) between the upper and lower conductive layers in a multilayer semiconductor device as disclosed in Japanese Patent Laying-Open Gazette No. 102754/1986. An SOG layer is a silicon oxide layer obtained by applying a solution of a silicon compound resolved in an organic solvent such as alcohol in the form of a thin film and evaporating the organic solvent at elevated temperatures.

FIGS. 2A–2D schematically illustrate the process sequence for manufacturing a conventional semiconductor device having multiple conductive layers using the SOG technique.

Referring first to FIG. 2A, there is shown a transfer gate transistor of the type having the lightly doped drain structure. The transistor includes a P-type semiconductor substrate 1 which is covered with an insulating layer 8. A plurality of transfer gate electrodes 9 are formed spaced apart on the insulating layer 8, and a pair of side wall oxide layers 10 are provided on the opposite sides of each transfer gate electrode 9. The semiconductor substrate 1 has an N-type impurity diffusion region 11 formed therein between the electrodes 9. An oxide layer 12 is deposited over the entire substrate, on top of which SOG is spun. The applied SOG is then thermoset into an SOG layer 13 at a temperature below 800° C. The SOG layer 13 thus formed over the oxide layer 12 effectively fills out the small depression formed in the oxide layer 12 between transfer gate electrodes 9 and provides a relatively smooth surface.

In FIG. 2B, a contact hole 15 is made to extend through the oxide layer 12 and the SOG layer 13 at a location between adjoining transfer gate electrodes 9 by anisotropically etching these insulating layers utilizing photolithography and reactive ion etching (or RIE) techniques. The contact hole 15 is provided for electrically connecting the impurity region 11 in the substrate to an upper conductive layer yet to be formed.

In FIG. 2C, the contact hole 15 thus formed is cleaned. The cleaning is carried out for the purpose of providing an improved and stable contact resistance at the hole. More specifically, in the wake of the previous anisotropic etching, there remain on the wall of the contact hole 15 polymers comprising single-bond or double-bond compounds of carbon and fluorine. In addition, a thin film of oxide is spontaneously grown on the contact hole wall 15. These undesirable polymers and the oxide film are removed from the hole wall by subjecting the contact hole 15 to a wet etching treatment with hydrofluoric acid. But the side effect of this treatment is that the SOG layer 13 is simultaneously and completely etched away since SOG is highly susceptible or sensitive to the etchant used.

In FIG. 2D, in order to form an upper conductive layer, a polysilicon layer 16 and a refractory metal silicide layer 17 are then successively deposited over the oxide layer 12. The polysilicon layer 16 and the silicide layer 17 thus deposited are selectively removed by mask and etch techniques to leave a desired pattern of the upper conductor. It should be noted at this point that the removal of the SOG layer 13 during the previous etching step in no way adversely affects the general configuration or profile of a contact hole 15, so that there is no risk of the polysilicon layer 16 and the silicide layer 17 being broken off at the portion thereof lying within the contact hole 15.

However, there arises a serious problem in a conventional process of manufacturing the semiconductor device described hereinabove. The problem is that the SOG layer 13 deposited on the substrate to obtain a relatively smooth, depression-free upper surface has been entirely removed by the etchant used to clean off the contact hole 15 because of its high susceptibility or sensitivity to the etchant. The complete removal of the SOG layer again exposes the numerous depressions that have been formed in the underlying oxide layer 12. And as previously stated, when the polysilicon layer 16 and the silicide layer 17 which form the upper conductive layer are deposited directly over the oxide layer 12, there are good chances that a breakage of the conductor occurs in this upper conductive layer.

SUMMARY OF THE INVENTION

It is an object of this invention to provide a multilayer semiconductor device having a plurality of conductive layers and adaptable to high density integration thereof.

It is another object of this invention to provide a semiconductor device having a plurality of conductive layers wherein electrical shorting and breach in an upper conductive layer due to underlying surface depressions caused by a lower conductive layer are effectively avoided.

It is yet another object of the invention to provide a semiconductor device having a plurality of conductive layers wherein shorting and breach of conductor within a through-hole for interconnecting upper and lower conductive layers are effectively avoided.

It is further object of the invention to provide an improved dynamic semiconductor memory device of multiconductor layer type having an FET element and a charge storing capacitor wherein shorting and breach in the multiconductor structure are effective avoided.

According to the invention, there is provided a semiconductor device having a plurality of conductive layers that includes a semiconductor substrate of one conductivity type and a plurality of first conductors provided to be adjacently spaced apart on the upper or major surface of the substrate. The first conductors together form a lower conductive layer. Formed in the substrate between adjacent first conductors are semiconductor regions of another conductivity type. A multilayer insulation comprising of at least three insulating layers is formed over the substrate and the first conductors. A hole extends through the multilayer insulation to either the semiconductor region in the substrate or one of the first conductors. A second conductive layer is formed as the upper conductive layer over the multilayer insulation and over the bottom and surrounding side wall of the hole. Thus, the upper conductive layer is in electrical contact with a lower conductive layer or the first conductor through the hole. Since the hole extends through the multilayer insulation, its surrounding side wall is defined by side walls formed in the three insulating layers where they are exposed at the hole. According to this invention, in one aspect of the invention each of the three insulating layers has its exposed side wall flush with the corresponding side wall of the overlying insulating layer. Or alternately, each insulating layer has its exposed side wall displaced laterally into the hole away from the corresponding side wall of the next overlying insulating layer.

This invention also provides a novel method for manufacturing a multilayer semiconductor device. According to the method, a plurality of first conductors are formed spaced apart on the upper or major surface of a semiconductor substrate. These first conductors comprise a lower conductive layer. Semiconductor regions of a conductivity type different from that of the semiconductor substrate are formed in the substrate surface between adjacent first conductors. Thereafter, a multilayer insulation consisting of at least three insulating layers are formed over the substrate and the first conductors. Selective removal of the multilayer insulation makes a hole which extends through the triple layer insulation to either the semiconductor region or the first conductor for electrical interconnection with an upper conductive layer to be formed over the multilayer insulation. The surrounding side wall of the hole, defined by corresponding side walls of the three insulating layers exposed at the hole, as well as the bottom wall of the hole is then cleaned. Through the cleaning step, the hole-defining side surfaces of the three insulating layers are conditioned such that the hole-defining side surface in each insulating layer lies flush with the corresponding side surface of the overlying insulating layer or lies displaced into the hole away from the corresponding side surface of the overlying insulating layer. A second conductive layer comprising an upper conductive layer is formed over the triple layer insulation and over the surrounding side wall and bottom wall of the hole.

In accordance with a preferred embodiment of the invention, the multilayer insulation has a triple layer structure which comprises upper and lower oxide layers and an intermediate silicon oxide layer sandwiched between the oxide layers. The silicon oxide layer is formed by applying a silicon contained liquid material in the form of a thin film. In another preferred embodiment, the semiconductor device may include FET elements and charge storage capacitors, semiconductor regions in the substrate forming a part of them. Part of the first conductors comprise insulated gate electrodes and the second conductor in the upper conductive layer is in electrical contact with the semiconductor regions or the insulated gate electrodes.

As briefly described, the semiconductor device of the invention includes a multilayer insulation formed on the first or lower conductive layer and comprising at least three insulating layers. This multilayer insulation is not noticeably removed by a wet etching process and effectively prevents undesired surface depressions from being caused in the insulating layer by the underlying conductors. Thus, no electrical shorting or break-off will occur in the conductor of the upper conductive layer provided on the multilayer insulation.

The multilayer insulation has the hole made therein for electrically interconnecting the upper conductive layer to lower conductive components. The hole-defining side surfaces in the three insulating layers are flush with one another. Alternately, the hole-defining side surface of each insulating layer is displaced into the hole away from the corresponding side surface of the overlying insulating layer. The hole configuration realized by the even or funnel-like stepped side surface arrangement is effective to prevent the conductor of the upper conductive layer from being broken on the surrounding side wall of the hole.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
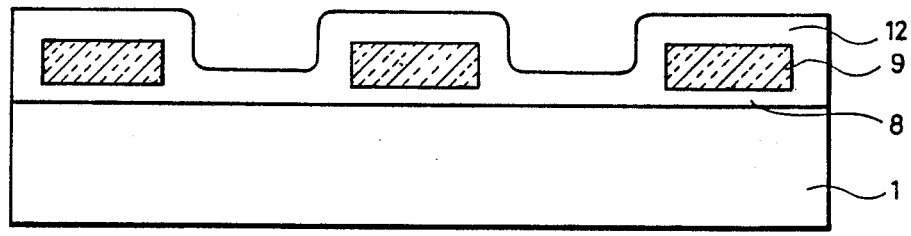
FIGS. 1A, 1B and 1C are schematic cross-sectional views which will be helpful in understanding how undesired surface depressions are caused by a lower conductive layer in an overlying insulating layer of the prior art multilayer semiconductor device.
Figure 1B:
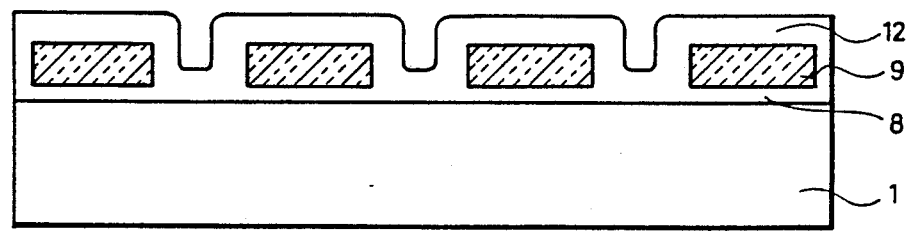
Figure 1C:
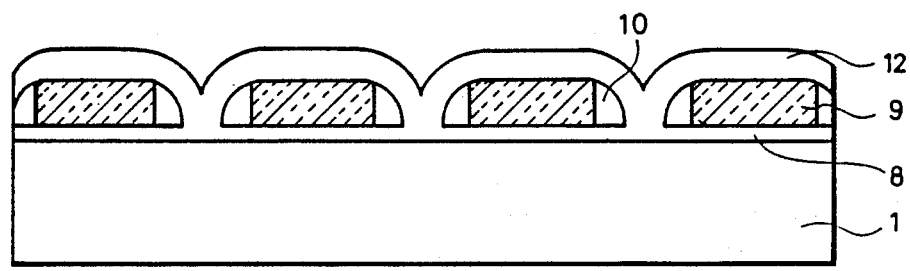
Figure 2A:
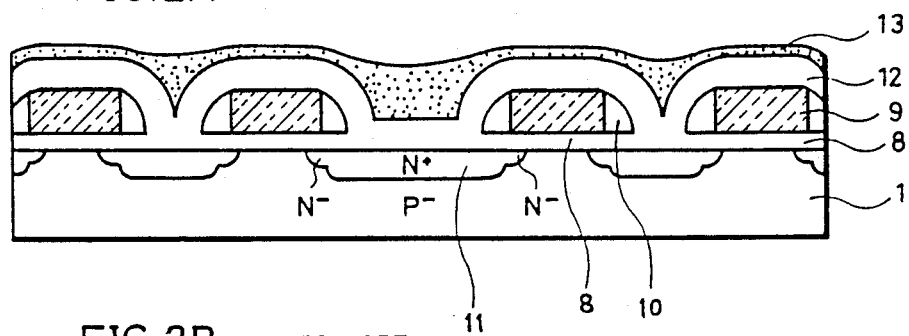
FIGS. 2A, 2B, 2C and 2D are schematic cross-sectional views showing successive steps in the process for manufacturing the prior art multilayer semiconductor device.
Figure 2B:
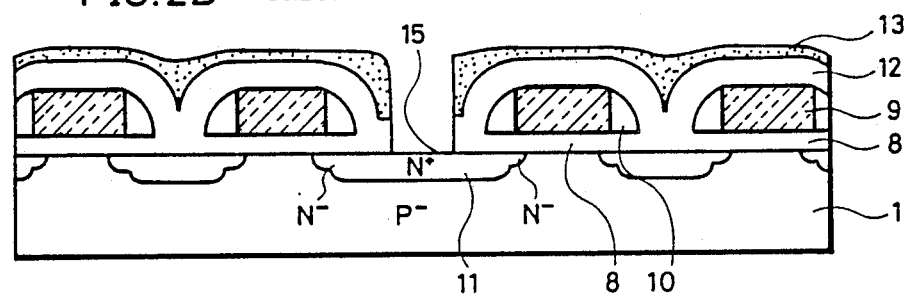
Figure 2C:
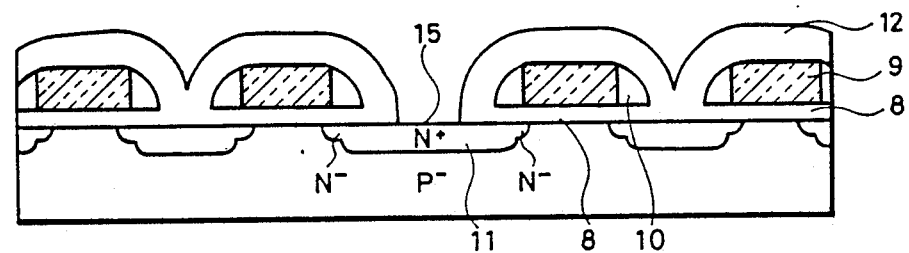
Figure 2D:
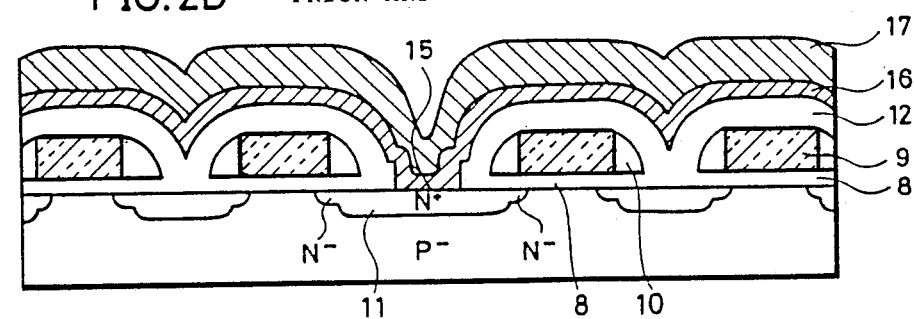
Figure 3A:
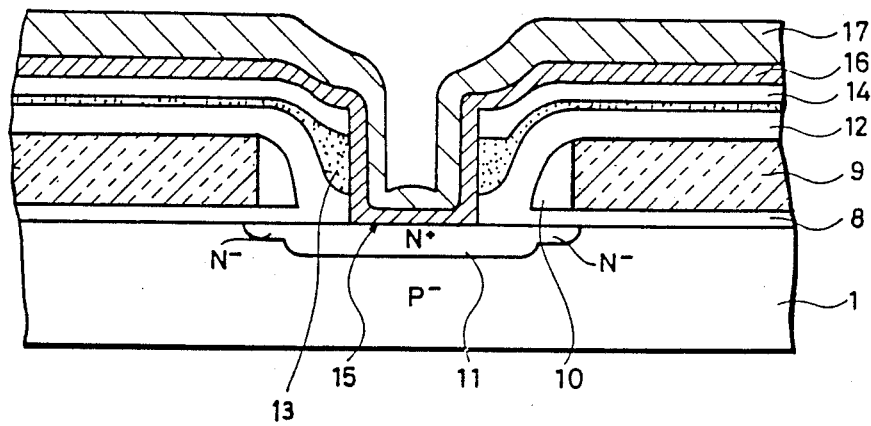
FIGS. 3A and 3B are schematic cross-sectional views of a multilayer semiconductor device made according to this invention showing in detail a contact hole formed in a multilayer insulation.

Referring to FIG. 3A, there is illustrated a semiconductor device having a plurality of conductive layers according to one embodiment of the invention. The semiconductor device includes a P-type semiconductor substrate 1, the upper or major surface of which is covered with an insulating layer 8. A plurality of transfer gate electrodes 9 (or word lines) are formed spaced apart adjacent to each other on the insulating layer 8 and comprise a lower conductive layer. Side oxide layers 10 are provided at the opposite side walls of the transfer gate electrodes 9 to realize a lightly doped drain structure. More specifically, an N-type impurity diffusion region 11 is formed in the substrate surface between adjacent transfer gate electrodes 9 and comprises a sub-region $N^-$ of lower dopant concentration and a sub-region $N^+$ of higher dopant density. This arrangement establishes a lightly doped drain structure.

An oxide layer 12 is deposited over the transfer gate electrodes 9 by chemical vapor deposition. An SOG layer 13 is then spun on the oxide layer 12. A second CVD oxide layer 14 covers the underlying SOG layer 13. The lower oxide layer 12, the intermediate SOG layer 13 and the upper oxide layer 14 together form a triple layer insulating structure. A contact hole 15 is made to extend through the triple layer insulation to the upper surface of the semiconductor substrate 1 at a location between the transfer gate electrodes 9 for the purpose of connecting an upper conductive layer yet to be formed to the N-type impurity diffusion region 11. Deposited successively over the upper oxide layer 14 are a polysilicon layer 16 and a refractory metal silicide layer 17 which are subsequently patterned into bit line conductors. Curved surfaces of the oxide layer 12 and 14 and the SOG layer 13 exposed at the contact hole 15 together define the surrounding side wall of the hole. As can be seen in FIG. 3A, the contact hole is made to have such a cross-sectional configuration that the hole-defining surfaces of the layer 12, 13 and 14 are flush with each other, lying on the same plane.

Figure 3B:
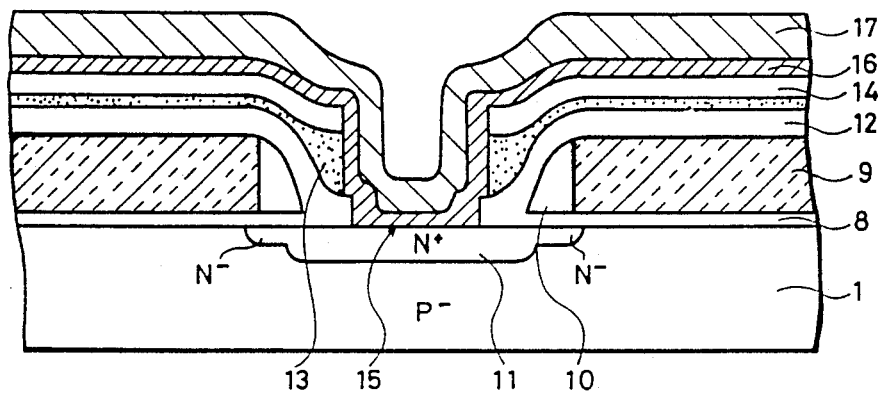

FIG. 3B shows a semiconductor device in accordance with another embodiment of the invention. The device is of essentially the same construction as the device of FIG. 3A except for the configuration of a contact hole 15. As shown, the contact hole 15 is made to have a stepped surrounding wall. Thus, the vertical surfaces of the intermediate SOG layer 13 and the upper oxide layer 14 exposed at the contact hole 15 are flush or even with each other, while the lower oxide layer 12 has its exposed surface displaced slightly inward from the vertical plane including the exposed surfaces of the overlying layers 13 and 14.

When the polysilicon layer 16 and the silicide layer 17 are successively deposited over the upper oxide layer 14, as previously explained, it also deposits on the surrounding side wall of the contact hole 15. The cross-sectional configuration of the contact holes as shown in FIGS. 3A and 3B are such that no breaking will occur in the polysilicon and silicide layers deposited on the side wall of the contact hole.

Figure 4A:
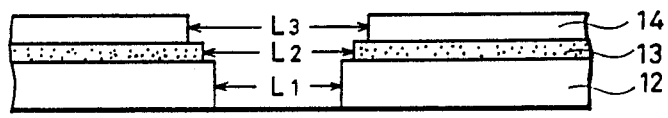
FIGS. 4A and 4B are schematic illustrations in section of part of a multilayer insulation where a contact hole is formed showing a desired contact hole configuration.
Figure 4B:
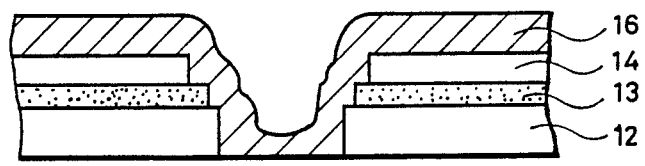

FIGS. 4A and 4B schematically illustrate the optimal cross-sectional profile of the contact hole as defined by the triple layer insulation comprising the lower oxide layer 12, the intermediate SOG layer 13 and the upper oxide layer 14. Lateral dimensions L1, L2, L3 in the insulating layers 12, 13, 14, respectively, indicates the diameter of the generally circular contact hole in individual insulating layers. If L1, L2 and L3 satisfy the relation $L1 \leq L2 \leq L3$, then the contact hole defined by those insulating layers is deemed to have the ideal or optimum cross-sectional profile in terms of avoiding any disconnection from occurring in the overlying polysilicon layer 16 which will be formed as part of the upper conductive layer.

FIGS. 5A-5D schematically illustrate successive stages in the process for manufacturing the semiconductor device according to the present invention.

Figure 5A:
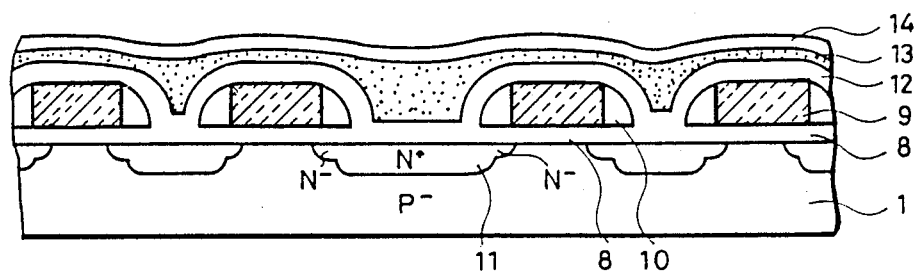
FIGS. 5A, 5B, 5C and 5D are schematic cross-sectional views showing successive steps in the process for making a multilayer semiconductor device according to this invention.

Referring to FIG. 5A, there is shown a transfer gate transistor having the LDD structure. The transistor includes a P-type semiconductor substrate 1. The upper or major surface of the semiconductor substrate 1 is coated with an insulating layer 8, and a plurality of spaced apart transfer gate electrodes 9 are provided on the insulating layer 8. Formed on the opposite sides of each transfer gate electrode 9 are side wall oxide layers 10. The substrate has an N-type impurity diffusion region 11 formed in the surface area between the transfer gate electrodes 9. An oxide layer 12 is deposited to cover the entire upper surface of the substrate. A thin film of SOG having a dose of impurity such as boron mixed therein is applied over the oxide layer 12. The purpose of adding the impurity to the SOG is to render SOG resistive to wet etching. In other words, this addition of the impurity greatly retards the etching action on the SOG film by an etchant used in a wet etching process. The applied SOG is thermally hardened at an elevated temperature not exceeding 800° C. to form an SOG layer 13 on the oxide layer 12. Instead of utilizing SOG premixed with the impurity, SOG not including such impurity may be spun and heated at an elevated temperature not exceeding 800° C. to form the SOG layer 13. Thereafter, a dose of impurity such as boron may be ion-implanted or diffused into the SOG layer 13. Subsequent to the formation of an SOG oxide layer, the CVD process is employed to deposit a second oxide layer 14 over the underlying SOG layer 13. It should be noted at this point that, as is the case with the prior art process, the SOG layer 13 fills out undesirable minute depressions appearing in the underlying oxide layer 12 at locations between the transfer gate electrodes 9, thereby providing a relatively smooth and flat surface.

Figure 5B:
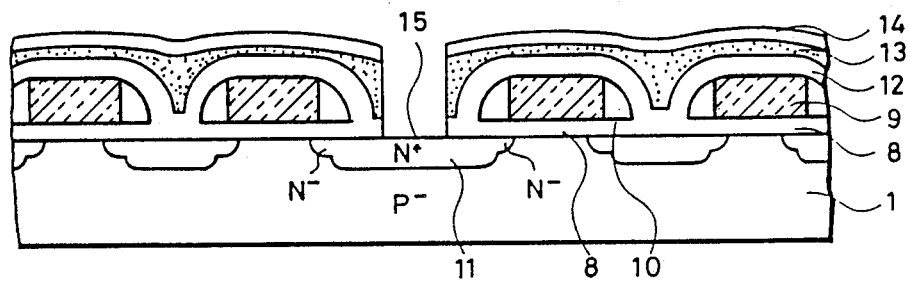

The next step in the manufacturing process is to make a contact hole 15 which extends vertically through the triple layer insulation formed of the lower oxide layer 12, the intermediate SOG layer 13 and the upper oxide layer 14 to the N-type impurity diffusion region 11 formed in the substrate surface as shown in FIG. 5B. This is accomplished by anisotropically etching the triple layer insulation at the designated location employing photolithography and reactive ion etching techniques.

Figure 5C:
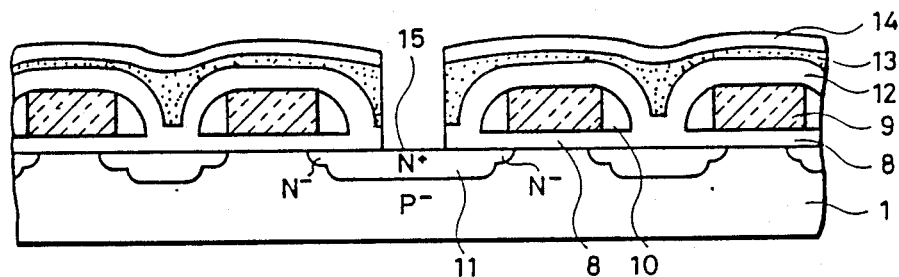

In FIG. 5C, the substrate structure is subject to wet etching in order to clean the peripheral wall of the contact hole 15. The purpose of this cleaning procedure has previously been explained in connection with the prior art manufacturing process. As discussed above, in accordance with a novel feature of the invention, the SOG layer 13 contains the impurity which serves to render the layer highly resistive to the wet etching treatment. Consequently, the curved surface of the SOG layer 13 exposed at the contact hole 15 and forming a part of the peripheral wall thereof is not appreciably etched back during the wet etching step, and it remains substantially flush with the corresponding surfaces of the oxide layers 12 and 14 exposed at the contact hole 15. In addition, the upper oxide layer 14 protects the underlying SOG layer 13 against the wet etching and there is no likelihood that the unwanted depressions in the lower oxide layer 12 will be exposed as a result of the complete stripping of the SOG layer 13 by the etchant as in the prior art process.

Figure 5D:
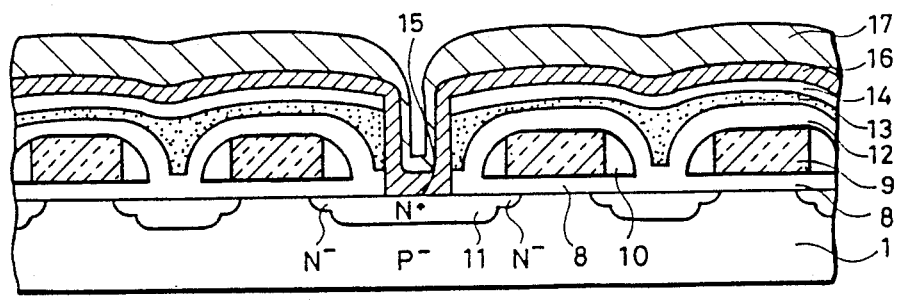

Referring to FIG. 5D, a polysilicon layer 16 and a refractory metal silicide layer 17 are successively deposited over the entire upper surface of the substrate. The deposited layers are then selectively etched away to form an upper conductive layer of a desired pattern layout. Note that the polysilicon layer 16 and the silicide layer 17 are deposited not only over the upper oxide layer 14 but along the vertical peripheral surface in the contact hole 15 defined by the triple layer insulation. The upper oxide layer 14 overlying the SOG layer 13 provides a relatively smooth and even supporting surface for the upper conductive layer, thus eliminating any possibility that the polysilicon and metal silicide layers are broken off on the upper oxide layer 14. The same is true within the contact hole 15. As previously stated, with the surrounding side wall of the contact hole substantially flat and even in the vertical direction, there is no risk of the polysilicon and metal silicide layers being broken on the contact hole side wall.

For the convenience of both reference and better understanding, the process sequence for manufacturing a similar multilayer semiconductor device is schematically illustrated in FIGS. 6A-6D. The process of FIGS. 6A-6D differs from that shown in FIGS. 5A-5D in that it does not utilize any impurity in the SOG layer for making the layer etch-resistant.

Figure 6A:
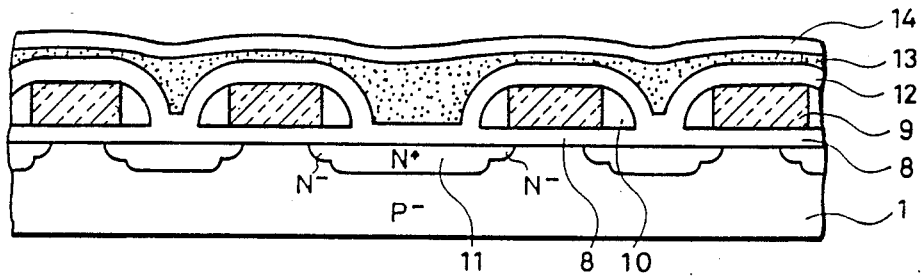
FIGS. 6A, 6B, 6C and 6D are schematic cross-sectional views showing, for the sake of comparison, successive steps of a manufacturing process comparable to the ones of FIGS. 5A-5D but without novel features of the invention incorporated therein.
Figure 6B:
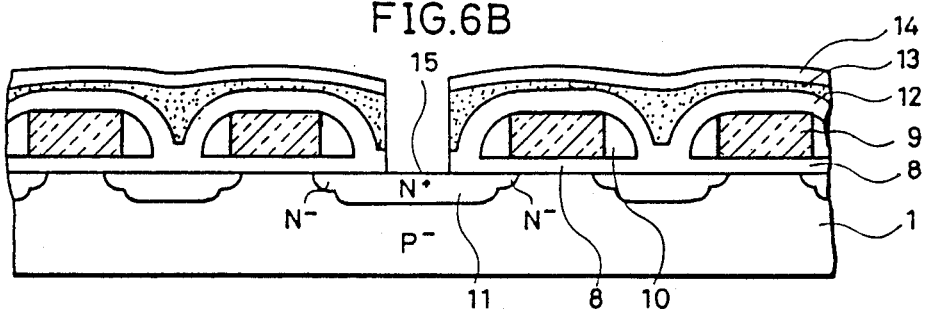

The steps shown in FIGS. 6A and 6B are identical to those of FIGS. 5A and 5B except that, in the former steps, no impurity is added to the SOG layer. Accordingly, no further description is given of these steps.

Figure 6C:
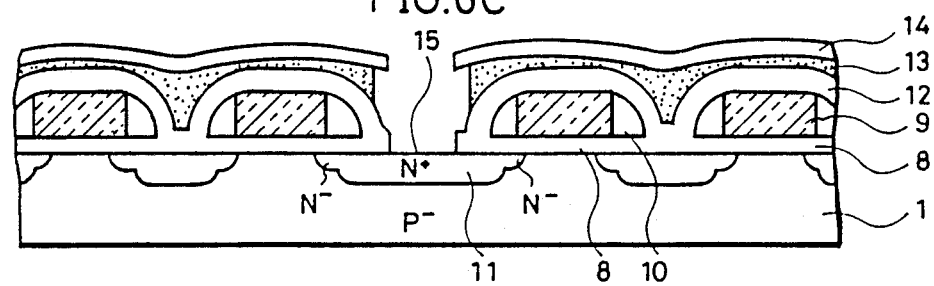

Referring to FIG. 6C, the contact hole 15 is subject to wet etching for the cleaning purpose. It is noted that the SOG layer 13 contains no impurity for rendering the layer highly resistive to the wet etchant. Thus, the SOG layer 13 is eaten rather quickly in its surface exposed at the surrounding side wall of the contact hole 15, while the exposed side surfaces of the lower and upper oxide layers 12 and 14 remain intact or unaffected during the wet etching step. Upon the completion of the wet etching, the exposed side surface in the SOG layer 13 is recessed or displaced backward away from the contact hole 15 with respect to the exposed side surfaces of the oxide layers 12 and 14, resulting in a deteriorated and undesirable contact hole configuration. On the other hand, being protected by the overlying oxide layer 14, the upper surface of the SOG layer 13 remains unaffected by wet etching. The deleterious depressions in the upper oxide layer 12 remain filled by the SOG layer 13 and, accordingly, are not exposed.

Figure 6D:
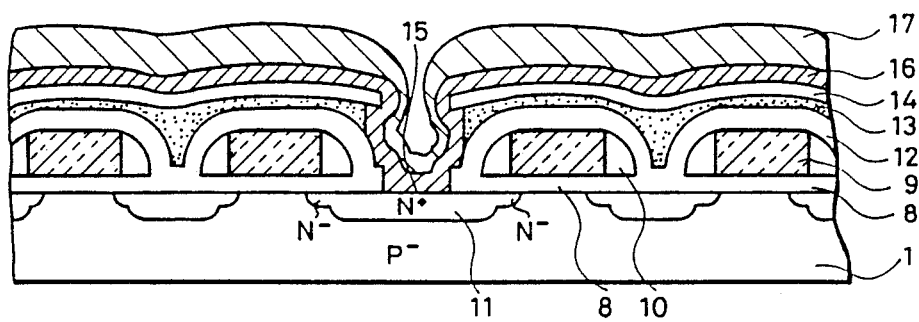
Figure 7:
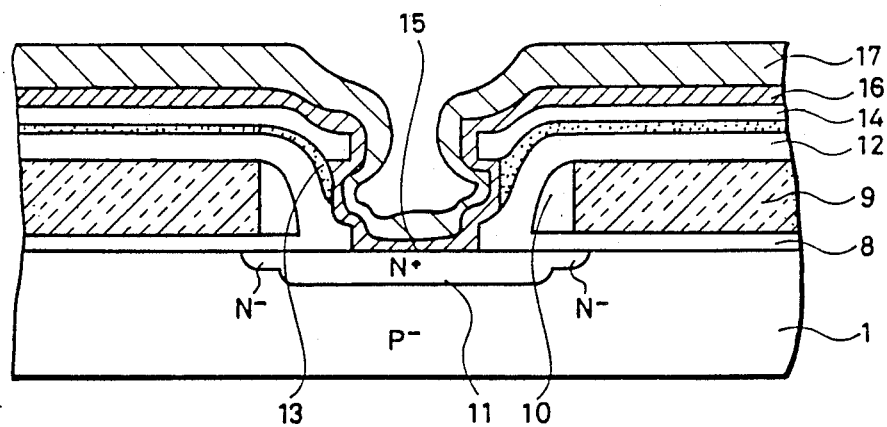
FIG. 7 is an enlarged fragmentary view in section of the contact hole made in the process of FIGS. 6A-6D.

In FIG. 6D, a polysilicon layer 16 and a refractory metal silicide layer 17 are successively deposited on the substrate structure. These layers 16 and 17 are then selectively etched using mask and etch to provide a desired pattern of an upper conductive layer. Within the contact hole 15, the polysilicon layer 16 and the silicide layer 17 are deposited on the staggered side wall, and there is good possibility that both layers could be broken off at the backwardly recessed side wall section in the SOG layer 13. Or else, the electrical resistance of the upper conductive layer formed of the polysilicon layer 16 and the silicide layer 17 may increase or become unstable within the contact hole 15. The situation resulting from the greatly impaired contact hole configuration is clearly shown in the enlarged cross-sectional representation of FIG. 7.

FIGS. 8A-8D schematically illustrate different contact hole profiles to be defined by the triple layer insulation which comprises the lower oxide layer 12, the intermediate SOG layer 13 and the upper oxide layer 14.

Figure 8A:
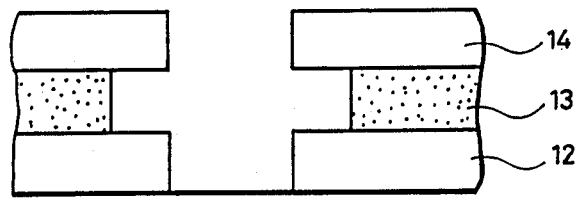
FIGS. 8A, 8B, 8C and 8D are schematic illustrations in cross-section of several contact holes showing hole-defining side walls of multiple insulating layers in accordance with this invention.

The contact hole profile of FIG. 8A can be obtained when the SOG layer 13 contains no impurity for making it resistive to wet etching. Without such impurity, the SOG layer 13 is highly susceptible to the wet etchant and is eroded backward away from the contact hole. Thus, the exposed side wall of the SOG layer 13 lies recessed or displaced with respect to the exposed side walls of the oxide layers 12 and 14. The contact hole profile defined by this side wall combination is not desirable for the reasons discussed above.

Figure 8B:
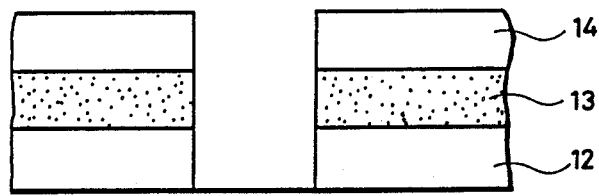

In FIG. 8B, the SOG layer 13 contains a dose of boron as the impurity for rendering the SOG highly resistant or immune to the wet etchant. The contact hole is shown after having been subjected to the wet etching. Since the SOG layer 13 is hardly removed by the etching, the exposed side wall in the SOG layer 13 lies substantially flush or coplanar with the exposed side walls in the lower and upper oxide layers 12 and 13.

Figure 8C:
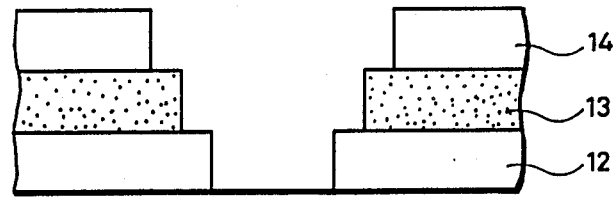

In FIG. 8C, a small amount of boron is added to the SOG layer 13 to make it slightly resistant to the wet etching, while the upper oxide layer 14 contains a dose of phosphorus or arsenic as the impurity to make the oxide layer susceptible to the wet etching. With this impurity allotment, when the contact hole is subject to the wet etching process, the SOG layer 13 is lightly etched back at the exposed side wall, while the upper oxide layer 14 is eaten back at its exposed side wall deeper than the underlying SOG layer 13. The lower oxide layer 12 remains unaffected because it contains no impurity for regulating the sensitivity to the wet etching. The result is a contact hole profile that tapers toward its bottom and satisifies the relation as explained in connection with FIG. 4A.

Figure 8D:
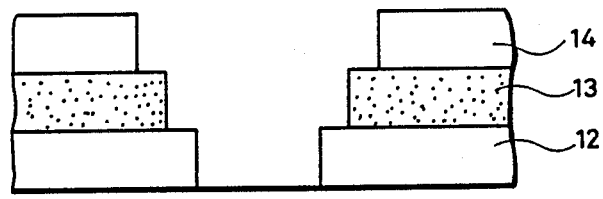

In FIG. 8D, only the SOG layer 13 contains, for example, a dose of boron as the susceptibility enhancing impurity. The lower oxide layer 12 has been deposited using low pressure CVD technique, whereas the upper oxide layer 13 has been deposited by means of CVD at atmospheric pressure. The wet etching on the contact hole leaves a tapered profile similar to that shown in FIG. 8C.

It is apparent that impurities used in the process of this invention effectively regulate or adjust the rate at which the non-conductive layers containing such impurities are removed by the wet etching step. The relations between the boron concentration in the SOG layer and the wet etching speed with respect to the SOG layer are disclosed in a paper entitled "On OCD-BSG" by Eiichi Kashiwagi (Lecture Proceedings, 5th Tokyo Ohka Seminar, Dec. 4, 1984, pp. 36–43).

Figure 9:
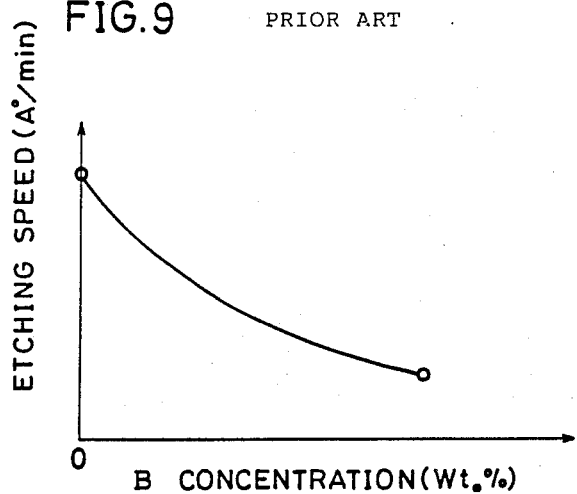
FIGS. 9 and 10 are graphic representations showing the relations between impurity concentration in one insulating layer and the rate at which the insulating layer is removed by wet etching.

A graphic representation of FIG. 9 shows boron concentration in the SOG layer vs. wet etching speed on the SOG layer. It is apparent from a curve in FIG. 9 that etching action on the SOG layer decreases as the boron concentration within the SOG increases. For example, when 50:1 hydrofluoric acid is used as an etching solution, the SOG layer with no impurity is found to be eroded at a rate of about 900 Å/min. With the SOG layer containing 8% by weight of boron, etching by hydrofluoric acid is as slow as 200 Å/min.

Figure 10:
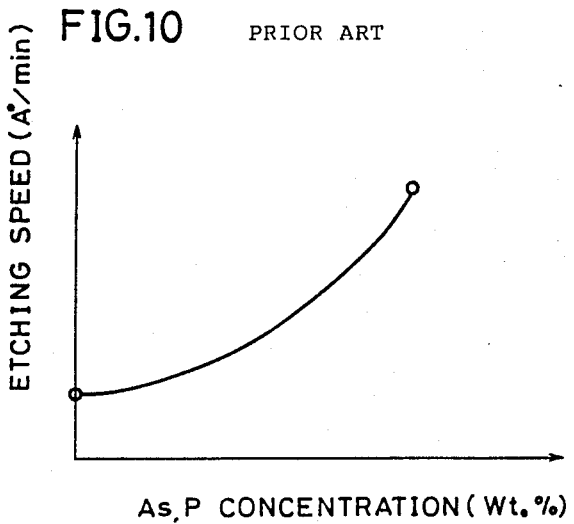

The curve of FIG. 10 shows arsenic or phosphorus concentration of the oxide layer vs. wet etching speed on the oxide layer. As can be seen, etching of the oxide layer by the wet etchant becomes faster with increasing arsenic or phosphorus concentration. Thus, arsenic and phosphorus contribute to make the oxide layer susceptible to wet etching.

Figure 11:
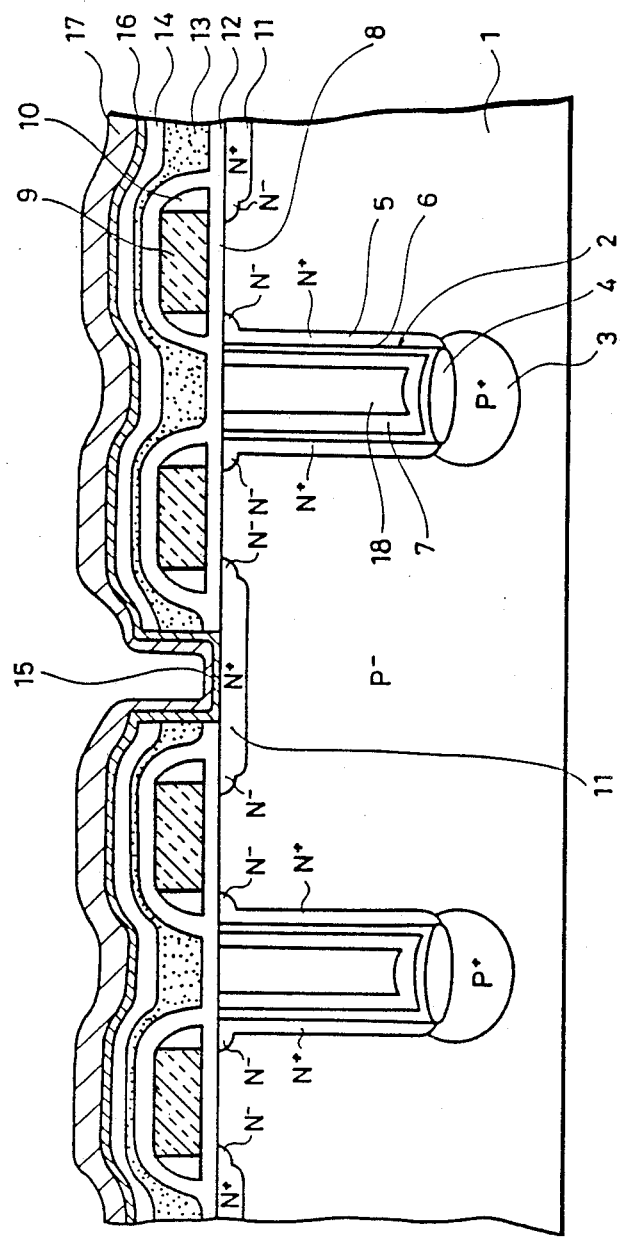
FIG. 11 is a cross-sectional view of a dynamic semiconductor memory device having built-in trench capacitor cells made in accordance with this invention.

Referring to FIG. 11, there is shown a multilayer semiconductor device having built-in trench capacitor cells in accordance with this invention. Note that the device can be suitably used as a dynamic semiconductor memory device. A process for making the trench capacitor cell is now described. In a P-type semiconductor substrate 1, there is formed a trench 2. Formed as by ion implantation at the bottom of the trench 2 within the substrate 1 is a P-type impurity diffusion region 3 which functions as an inversion inhibit region. A thick isolation oxide layer 4 is overlaid on the P-type impurity diffusion region 3 for component isolation. On the side wall of the trench, an N-type impurity diffusion region 5 is formed as by ion implantation. A gate insulating layer 6 is then deposited over the impurity diffusion region 5 using thermal oxidation or CVD techniques. A polysilicon material containing conductive impurities such as phosphorus and arsenic is grown on the gate insulating layer 6 by CVD. The polysilicon layer is then selectively etched to form a cell plate 7. Subsequent to the formation of the cell plate 7, the trench 2 is filled with an oxide or an electrode forming material such as polysilicon or the combination of them. For example, the combination of a relatively thin oxide layer and the polysilicon layer are used to fill out the trench cell and forms a buried isolation region 18. A transfer gate insulating layer 8 is grown over the surface of the semiconductor substrate 1 as by thermal oxidation, upon which transfer gate electrodes 9 are formed spaced apart from one another. The transfer gate electrode 9 may be formed of a single layer of polysilicon or refractory metal such as Mo, W and Ti. Or the electrode may be formed of double layers of polysilicon and refractory metal silicide (a polysilicide layer). For the purpose of providing an LDD structure, N-type impurity ions, for example, arsenic ions are implanted into the substrate surface. Thereafter, side wall oxide layers 10 are formed on the opposite sides of each transfer gate electrode 9. The implantation of N-type impurity ions is again carried out into the substrate surface, and an N-type impurity diffusion region 11 of an LDD structure is obtained after a heat treatment. This finalizes a trench capacitor cell.

Figure 12:
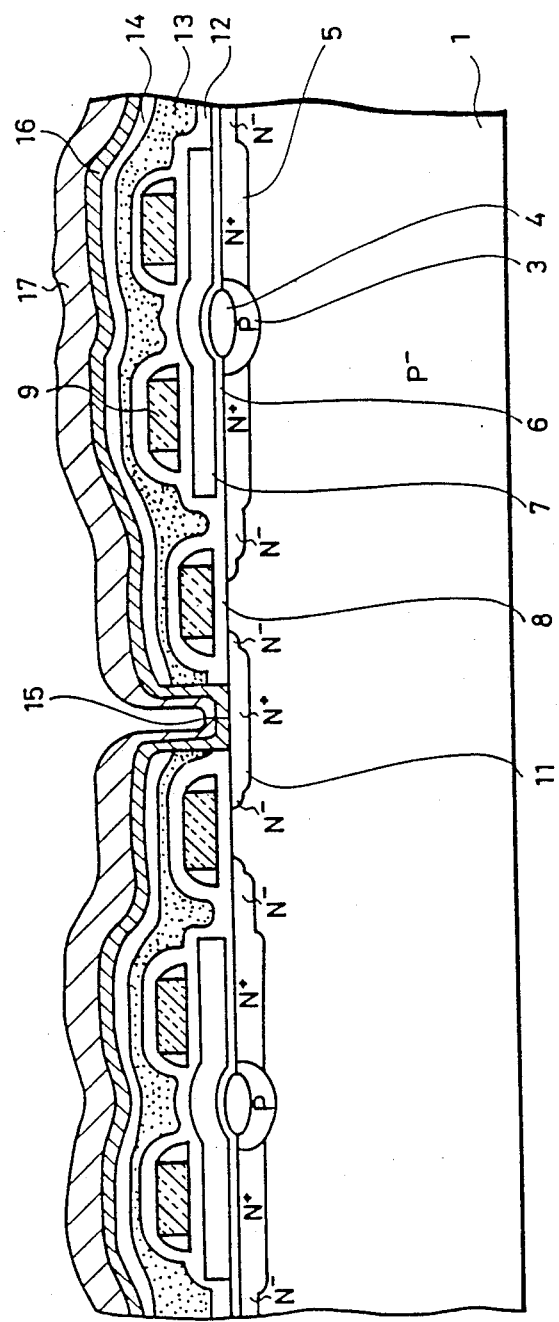
FIG. 12 is a cross-sectional view of a dynamic semiconductor memory device having built-in planar capacitor cells.

In FIG. 12, there is shown a multilayer semiconductor device having a built-in planar capacitance cell in accordance with the invention. The device comprises a dynamic semiconductor memory device. The process for making the planar capacitance cell is substantially identical to that described with reference to FIG. 11 and no further explanation is given.

FIGS. 13A–13D schematically illustrate successive steps in the manufacture of multilayer semiconductor device in accordance with another embodiment of the invention.

Figure 13A:
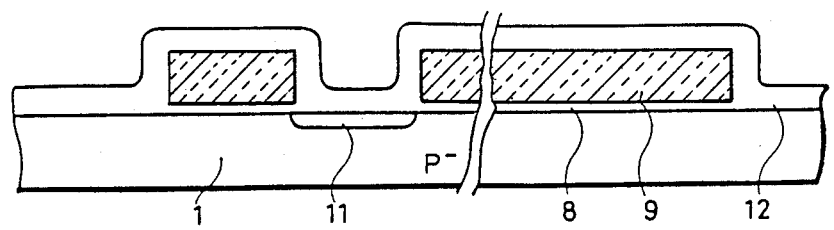
FIGS. 13A, 13B, 13C and 13D are schematic cross-sectional views of another multilayer semiconductor device, at successive steps in the manufacture thereof, which may be made according to this invention.

Referring to FIG. 13A, transfer gate electrodes 9 formed of polysilicon, refractory metal or refractory metal silicide are provided on an insulating layer 8 which overlies a P-type semiconductor substrate 1. These electrodes 9 form a first conductive layer. An N-type impurity diffusion region 11 is formed in the substrate surface between adjacent transfer gate electrodes 9. Using CVD, an oxide layer 12 is deposited over the electrodes 9.

Figure 13B:
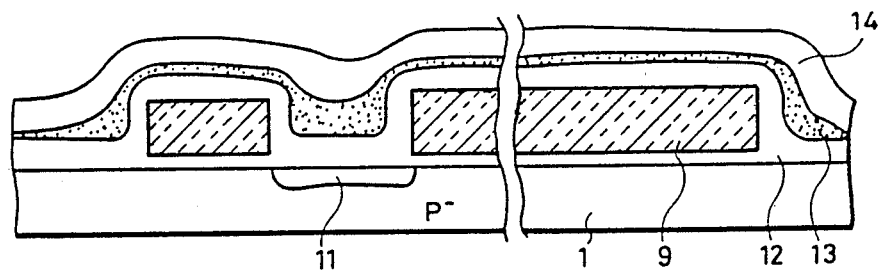

In FIG. 13B, a coating of SOG is spun on the oxide layer 12 and heated to deposit an SOG layer 13. Note that the SOG contains an impurity such as boron to render the SOG layer resistant to wet etching. The etching resistivity of the SOG layer is preferably so adjusted that the SOG layer is etched at a slightly faster rate than the underlying oxide layer 12. An oxide layer 14 is then grown on the SOG layer 13 using CVD and this oxide layer contains phosphorus impurity which makes the layer highly sensitive to the wet etching procedure.

Figure 13C:
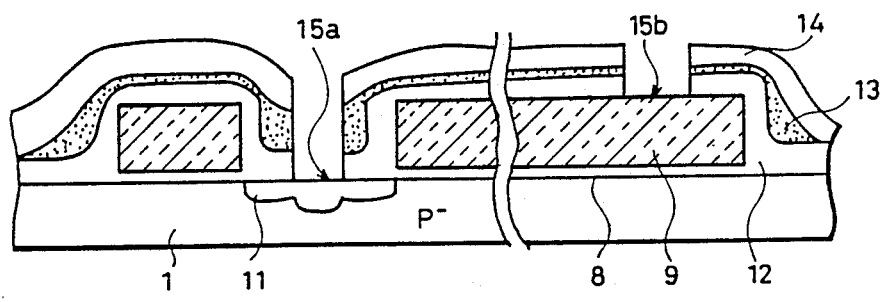

Referring to FIG. 13C, anisotropic etching is carried out using photolithography and dry etching techniques in order to produce contact holes 15a and 15b. As can be seen, the contact hole 15a extends vertically to the N-type impurity diffusion region 11, while the contact hole 15b to one transfer gate electrode 9. It should be pointed out at this point that the SOG layer 13 and the upper oxide layer 14 exposed at contact holes 15a and 15b remain unaffected by this anisotropic etching step because it is essentially a dry etching procedure.

Figure 13D:
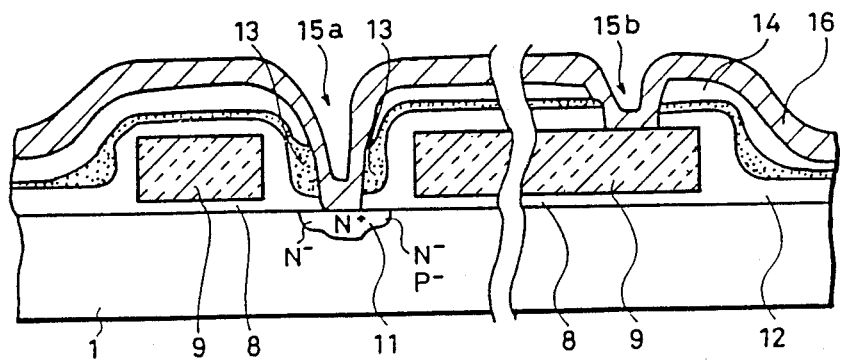

As shown in FIG. 13D, prior to the formation of the second conductive layer, the contact holes 15a and 15b are cleaned by wet etching in order to remove oxide films spontaneously formed on the surrounding walls of the holes and to improve the contact resistance in the holes. During this wet etching, both the SOG layer 13 and the upper oxide layer 14 exposed at the surrounding side wall of the contact holes 15a and 15b are eroded by the etchant. With the addition of boron into the SOG layer 13 for increasing its etching resistivity, and phosphorus into the upper oxide layer 14 for lowering its etching resistivity as hereinabove described, the upper oxide layer 14 is more sensitive to the wet etchant than the underling SOG layer 13 which, in turn, has an etching susceptibility slightly greater than the lower oxide layer 12. Upon completion of the wet etching step, the contact holes 15a and 15b have generally ideal tapered configurations shown in FIG. 4A, since the upper oxide layer 14 has been eaten back deeper than the intermediate SOG layer 13 with the lower oxide layer 12 remaining substantially unaffected. The cleaning of the contact hole is followed by a step to deposit a polysilicon layer 16 over the upper oxide layer 14 and on the surrounding side walls of the contact holes 15a and 15b. The polysilicon layer 16 forms a second conductive layer in the device. The contact holes having generally ideal configurations and providing smooth uninterrupted side wall, the second conductive layer will not be broken within the contact holes.

While the upper oxide layer 14 has been made more susceptible to the wet etchant by the introduction of phosphorus, the same result is obtainable by depositing the oxide layer using atmospheric pressure CVD or plasma CVD techniques.

In the preferred embodiment described, boron, arsenic and phosphorus are used as the impurities to adjust the susceptibility or resistivity to the wet etching without the intention of limiting to them. Thus, any other substance which exhibits similar capacities may be used to advantage. Also, in the preferred embodiment, although the triple layer insulation comprising upper and lower oxide layers and an intermediate SOG layer has been shown and described, an insulating structure having more than three layers may be incorporated. Any insulating layer other than the oxide and SOG layers may also be used. Moreover, in order to obtain the desired contact hole configuration, the resistivity or susceptibility of the hole-defining layers has been adjusted by the addition of impurities or by using different techniques for forming those layers. However, any other expedient may suitably be employed as long as it is effective to realize the side wall profile which accomplishes the described relations.

It can be seen from the foregoing description that since the insulating structure provided between the lower or first conductive layers and the upper or second conductive layers comprises three or more insulating layers, it will never be etched completely away during the cleaning process by means of the wet etching, and the insulating structure effectively prevents undesirable depressions or pits from being formed therein. Moreover, the contact hole made through the triple layer insulating structure for connecting the upper and lower components with each other has such an internal configuration that the upper conductive layer will not be broken at the portion thereof formed on the surrounding side wall of the hole. A net result is that an improved semiconductor device having more than two conductive layers is provided which effectively eliminates the possibility of shorting and breaking in the conductive layers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a plurality of conductive layers, comprising:
   a semiconductor substrate of a first conductivity type, having a major surface;
   a plurality of first level conductors formed and disposed to be adjacently spaced apart from one another on said major surface of said semiconductor substrate;
   semiconductor regions of a second conductivity type provided in said semiconductor substrate between adjacent ones of said first level conductors;
   a multilayer insulation formed of at least three insulating layers positioned over said semiconductor substrate and said first level conductors and having at least one hole formed and selectively located to extend therethrough to reach at least either of one of said semiconductor regions or one of said first level conductors at a bottom surface of said at least one hole;
   said hole having a surrounding side wall defined by a corresponding exposed hole-defining surface of each of said at least three insulating layer, said hole-defining surfaces being either flush with or displaced gradually inward of said hole and
   a plurality of second level conductors formed as layers over said multilayer insulation and disposed to each extend into said at least one hole to cover said surrounding side wall and said bottom surface of said hole to thereby make conductive contact with the selected one of said semiconductor regions or one of said first level conductors,
   wherein said multilayer insulation includes a plurality of oxide layers and an SOG (spin-on-glass) layer, formed by applying a liquid substance containing silicon in the form of a thin film, the SOG layer thus provided becoming sandwiched between two of said oxide layers.

2. A semiconductor device having a plurality of conductive layers in accordance with claim 1, further comprising:
   a known type of semiconductor element formed in said major surface of said semiconductor substrate adjacent to selected ones of said semiconductor regions of second conductivity type.

3. A semiconductor device having a plurality of conductive layers in accordance with claim 2, wherein:
   said selected semiconductor regions of second conductivity type form part of a field effect device.

4. A semiconductor device having a plurality of conductive layers in accordance with claim 3, wherein:
   said field effect device comprises an insulated gate and a pair of said selected semiconductor regions provided spaced apart in said semiconductor substrate under said insulated gate, said pair of selected semiconductor regions defining therebetween and within said semiconductor substrate a channel region.

5. A semiconductor device having a plurality of conductive layers in accordance with claim 4, wherein:
said first level conductors comprise part of said insulated gate.

6. A semiconductor device having a plurality of conductive layers in accordance with claim 5, wherein:
said second level conductors include a conductor in electrical contact with one of said pair of selected semiconductor regions.

7. A semiconductor device having a plurality of conductive layers in accordance with claim 6, wherein:
said one of said pair of selected semiconductor regions is isolated by an isolation region.

8. A semiconductor device having a plurality of conductive layers in accordance with claim 7, wherein:
an inversion inhibit region is formed in said semiconductor substrate under said isolation region.

9. A semiconductor device having a plurality of conductive layers in accordance with claim 8, wherein:
said inversion inhibit region has the same first conductivity type as said semiconductor substrate and a higher impurity concentration than that of said semiconductor substrate.

10. A semiconductor device having a plurality of conductive layers in accordance with claim 9 further comprising:
an insulating layer formed on said one of said pair of selected semiconductor regions and said isolation region, and a conductive layer formed on said insulating layer, whereby said conductive layer and said one of said pair of selected semiconductor regions form a storage capacitor.

11. A semiconductor device having a plurality of conductive layers in accordance with claim 10, wherein:
said one of said pair of selected semiconductor regions is provided along a surrounding side wall of a trench formed in said semiconductor substrate.

12. A semiconductor device having a plurality of conductive layers in accordance with claim 10, wherein:
said one of said pair of selected semiconductor regions is provided in the major surface of said semiconductor substrate.

* * * * *